(12) United States Patent
Sinha

(10) Patent No.: US 7,750,477 B2
(45) Date of Patent: Jul. 6, 2010

(54) THROUGH-HOLE CONTACTS IN A SEMICONDUCTOR DEVICE

(75) Inventor: Nishant Sinha, Boise, ID (US)

(73) Assignee: Round Rock Research, LLC, Mount Kisco, NY (US)

( * ) Notice: Subject to any disclaimer, the term of this patent is extended or adjusted under 35 U.S.C. 154(b) by 0 days.

(21) Appl. No.: 11/677,257

(22) Filed: Feb. 21, 2007

(65) Prior Publication Data

US 2007/0158853 A1 Jul. 12, 2007

Related U.S. Application Data

(62) Division of application No. 11/183,441, filed on Jul. 18, 2005, now Pat. No. 7,265,052, which is a division of application No. 10/267,822, filed on Oct. 9, 2002, now Pat. No. 6,936,536.

(51) Int. Cl.
*H01L 23/48* (2006.01)
(52) U.S. Cl. ............................ 257/774; 257/E23.145
(58) Field of Classification Search ......... 257/780–786, 257/774, E23.011, E23.145
See application file for complete search history.

(56) References Cited

U.S. PATENT DOCUMENTS

| 5,024,966 | A | 6/1991 | Dietrich et al. | 438/23 |
|---|---|---|---|---|
| 5,998,292 | A | 12/1999 | Black et al. | 438/618 |
| 6,221,769 | B1 * | 4/2001 | Dhong et al. | 438/667 |
| 6,359,328 | B1 * | 3/2002 | Dubin | 257/622 |
| 6,359,382 | B1 | 3/2002 | Dubin | 257/622 |
| 6,664,485 | B2 | 12/2003 | Bhatt et al. | |
| 6,809,025 | B2 | 10/2004 | Sandhu et al. | 438/625 |
| 6,858,891 | B2 | 2/2005 | Farnworth et al. | 257/296 |
| 6,936,536 | B2 | 8/2005 | Sinha | |
| 7,265,052 | B2 | 9/2007 | Sinha | |

OTHER PUBLICATIONS

Peter Van Zant, Microchip Fabrication, 2000, McGraw-Hill, pp. 400 and 401.*
Hausmann et al., "Rapid Vapor Deposition of Highly Conformal Silica Nanolaminates," Science, 298:402-06, 2002.

* cited by examiner

*Primary Examiner*—Brook Kebede
(74) *Attorney, Agent, or Firm*—Lerner, David, Littenberg, Krumholz & Mentlik, LLP

(57) ABSTRACT

Devices with conductive through-wafer vias. In one embodiment, the device is formed by a method comprising providing a layer of semiconducting material, forming a layer of metal on a first side of the layer of semiconducting material, forming an opening in the layer of semiconducting material to thereby expose a portion of the layer of metal, the opening extending from at least a second side of the layer of semiconducting material to the layer of metal, and performing a deposition process to form a conductive contact in the opening using the exposed portion of the metal layer as a seed layer.

10 Claims, 6 Drawing Sheets

THROUGH-HOLE CONTACTS IN A SEMICONDUCTOR DEVICE

CROSS-REFERENCE TO RELATED APPLICATIONS

This is a divisional of application Ser. No. 11/183,441, filed Jul. 18, 2005 now U.S. Pat. No. 7,265,052, which is a divisional of application Ser. No. 10/267,822, filed Oct. 9, 2002, now U.S. Pat. No. 6,936,536, issued Aug. 30, 2005.

BACKGROUND OF THE INVENTION

1. Field of the Invention

This present invention is generally directed to the field of semiconductor manufacturing, and, more particularly, to various methods of forming conductive through-wafer vias.

2. Description of the Related Art

Integrated circuit technology relies on transistors to formulate vast arrays of functional circuits. The complexity of these circuits requires the use of an ever-increasing number of linked transistors. As the number of transistors increases, the integrated circuitry dimensions shrink. One challenge in the semiconductor industry is to develop improved methods for electrically connecting and packaging circuit devices which are fabricated on the same and on different wafers or chips. In general, it is desirable in the semiconductor industry to construct transistors which occupy less surface area on the silicon chip/die.

As integrated circuit technology progresses, there is a growing desire for a "system on a chip." Ideally, a computing system would be fabricated with all the necessary integrated circuits on one wafer, as compared with today's method of fabricating many chips of different functions and packaging them to assemble a complete system. Such a structure would greatly improve integrated circuit performance and provide higher bandwidth. In practice, it is very difficult with today's technology to implement a truly high-performance "system on a chip" because of vastly different fabrication processes and different manufacturing yields for the logic and memory circuits. Thus, what is needed is an improved method and structure which continues to approach the ideal set-up of a "system on a chip" and thus improves the integration of different chips in an integrated circuit.

As a result, there are economic advantages associated with forming a module or system from an interconnected group of different types of previously-tested integrated circuits (i.e., known good die). Further advantages can result from mounting the different types of integrated circuits in die form on a common substrate and then encapsulating the composite assembly in a package common to all of the die to form a module, known as a multichip module or MCM. In MCMs, the die are interconnected to wiring formed on the common substrate, also known as an interposer, using conventional interconnection technology.

As the area of each die in an MCM increases, a mismatch between the thermal coefficient of expansion of the die and the interposer becomes increasingly critical, at least in part because the thickness of the material forming the die is not increased as the area of the die is increased. One solution to this problem is to make the interposer from the same material that the die are made from, e.g., silicon. This allows increasingly complex integrated circuits to be interconnected without exaggerating thermal coefficient of expansion mismatch problems that could occur either during packaging or as a result of thermal cycling in normal use. Additionally, passive components may be formed or mounted on the interposer.

FIG. 1 is a simplistic, cross-sectional view of an illustrative prior art packaging assembly 11. As shown therein, a silicon interposer 10 is positioned within an integrated circuit package 13. An insulating layer 10A is formed on the exposed surfaces of the silicon interposer 10. A plurality of metal connectors 17 are formed on the interposer 10. A plurality of conductive contacts 12 extend through openings formed in the interposer 10. The interconnects 17 on the package 13 may be coupled to the interconnects 17 on the interposer 10 by, for example, a wire bond 19. A plurality of integrated circuit devices 15A, 15B, 15C may be operatively coupled to one another via the interconnects 17 formed on the interposer 10. For example, the integrated circuits 15A, 15B and 15C may be, respectively, a microprocessor, a capacitor and a memory device (e.g., a DRAM, an SRAM, etc.).

One illustrative prior art technique for forming such through-hole contacts will now be described with reference to FIGS. 2A-2D. As shown in FIG. 2A, a plurality of openings 22 are formed in a semiconducting substrate 20, such as silicon. The openings 22 may be formed using known photolithography and etching processes. Next, a layer of insulating material 21 may be formed on the exposed surfaces of the substrate 20. The layer 21 may be formed by a thermal oxidation process or a chemical vapor deposition process. Thereafter, if desired, a barrier metal layer, such as tantalum, may be formed above the layer of insulating material 21 and in the openings 22. For purposes of clarity, the barrier metal layer is omitted from the referenced figures.

The next process involves the formation of a seed layer 24, e.g., a copper seed layer. The copper seed layer 24 may be conformally formed on the substrate 20 and in the openings 22. The copper seed layer 24 may have a thickness of approximately 20-100 nm, and it may be formed by, for example, a physical vapor deposition (PVD) process or a chemical vapor deposition (CVD) process. Thereafter, an electrical (electroplating) or chemical (electroless) process may be performed to deposit the bulk copper layer 26 above the substrate 20 and in the openings 22, as indicated in FIG. 2C. Then, one or more chemical mechanical polishing (CMP) operations are performed to remove the excess bulk copper layer 26, thereby leaving the through-hole contacts 25 in the openings 22, as shown in FIG. 2D. Additional processing operations may be performed to couple one or more integrated circuit devices, e.g., memory devices, logic devices, etc., to the desired contacts 25.

The above-referenced process flow may be problematic in many respects for future technologies. For example, the aspect ratio of the openings 22 will tend to increase in future generation products. As a result, the conformal deposition of the copper seed layer 24 may be more difficult to achieve. Such difficulties may lead to the formation of voids in the contacts 25, all of which will reduce the efficiency of the contacts 25.

The present invention is directed to a method that may solve, or at least reduce, some or all of the aforementioned problems.

SUMMARY OF THE INVENTION

The present invention is generally directed to various methods of forming conductive through-wafer vias. In one illustrative embodiment, the method comprises providing a layer of semiconducting material, forming a layer of metal on a first side of the layer of semiconducting material, forming an opening in the layer of semiconducting material to thereby expose a portion of the layer of metal, the opening extending from at least a second side of the layer of semiconducting material to the layer of metal, and performing a deposition process to form a conductive contact in the opening using the exposed portion of the metal layer as a seed layer.

In another illustrative embodiment, the method comprises providing a layer of semiconducting material, forming a first layer of insulating material on a first side of the layer of semiconducting material, forming a layer of metal on the first layer of insulating material, forming an opening in the layer of semiconducting material and the first layer of insulating material to thereby expose a portion of the layer of metal, the opening extending from at least a second side of the layer of semiconducting material to the layer of metal, and performing a deposition process to form a conductive contact in at least the opening using the exposed portion of the metal layer as a seed layer.

BRIEF DESCRIPTION OF THE DRAWINGS

The invention may be understood by reference to the following description taken in conjunction with the accompanying drawings, in which like reference numerals identify like elements, and in which.

Figure 1:
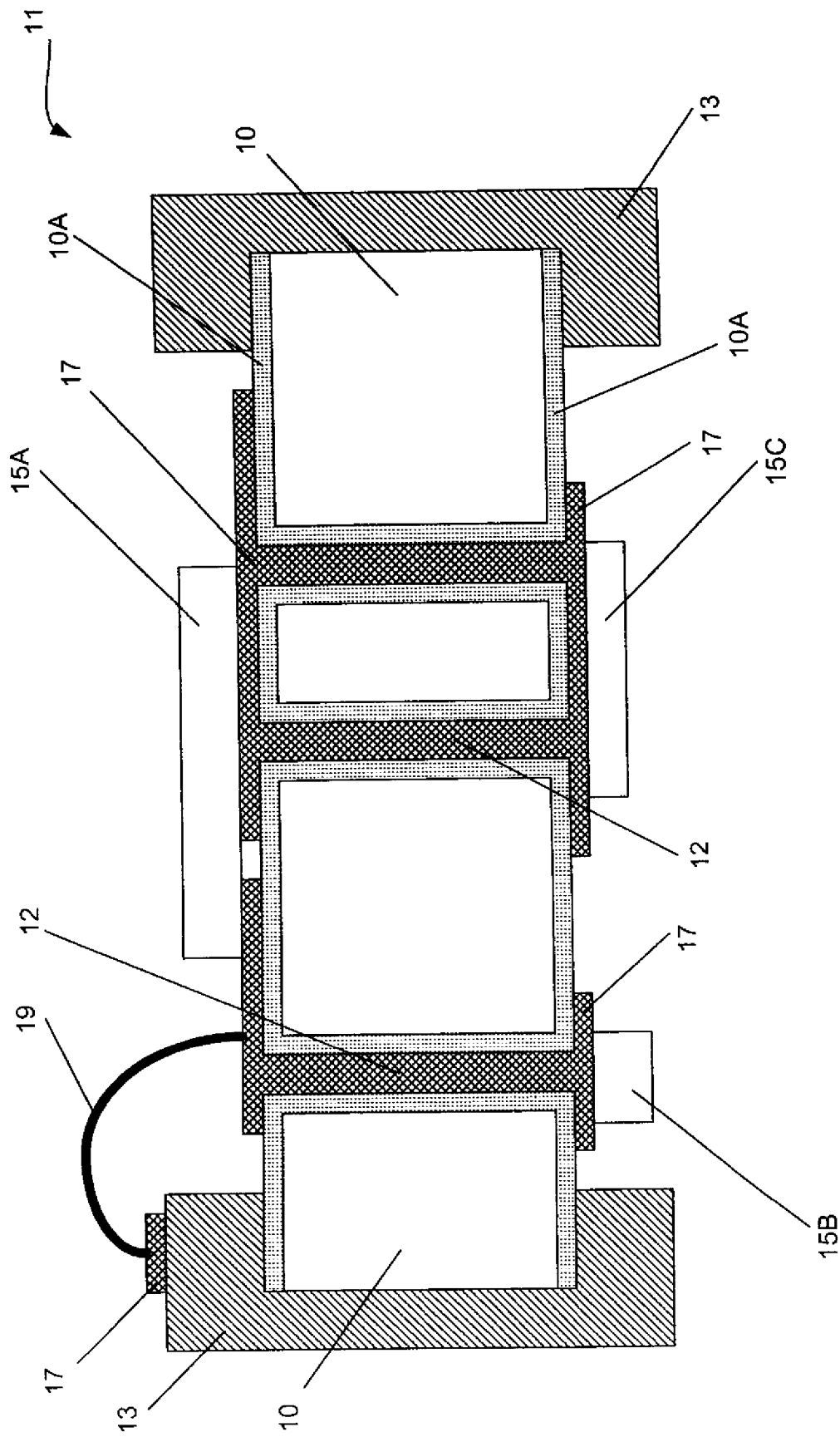
FIG. 1 is a cross-sectional view depicting one illustrative example of a prior art silicon interposer.
Figure 2A:
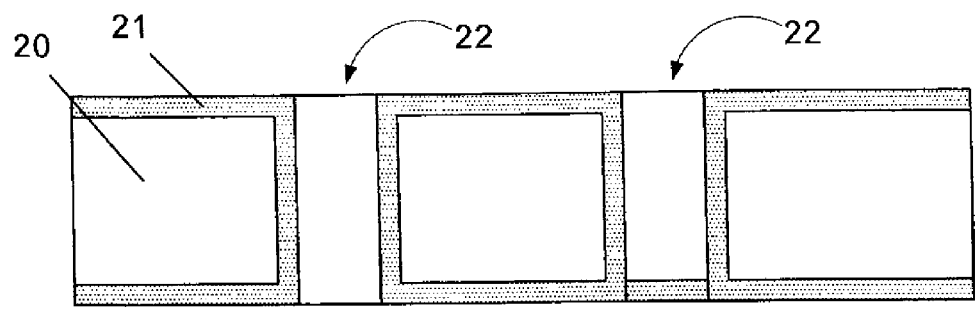
FIGS. 2A-2D depict one illustrative prior art process flow for forming through wafer contacts.
Figure 2B:
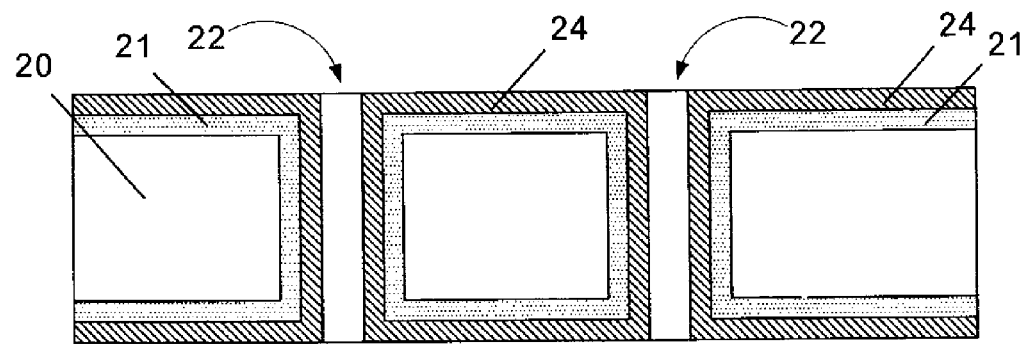
Figure 2C:
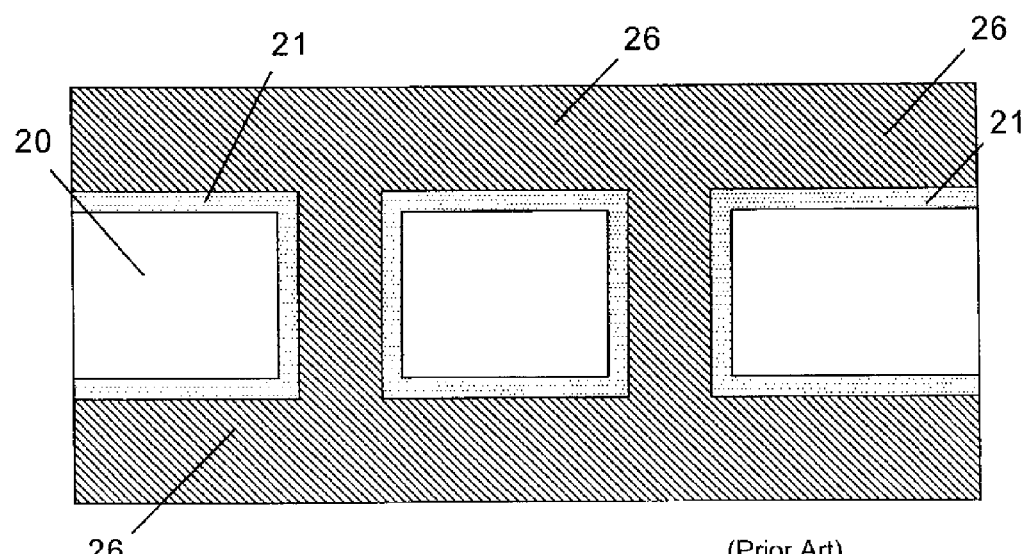
Figure 2D:
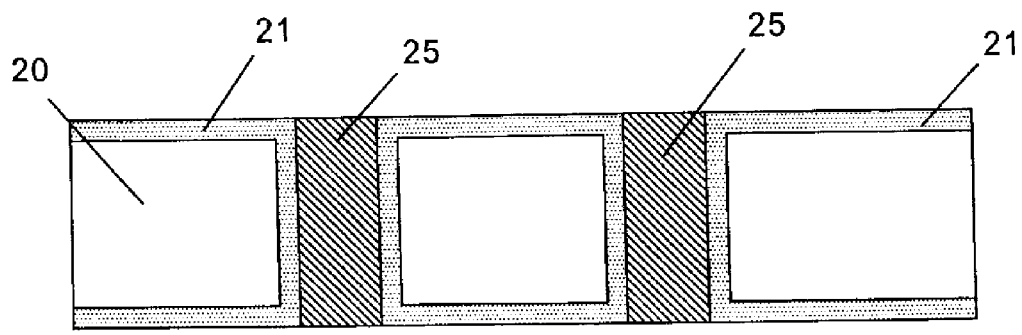

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although various regions and structures shown in the drawings are depicted as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 3A:
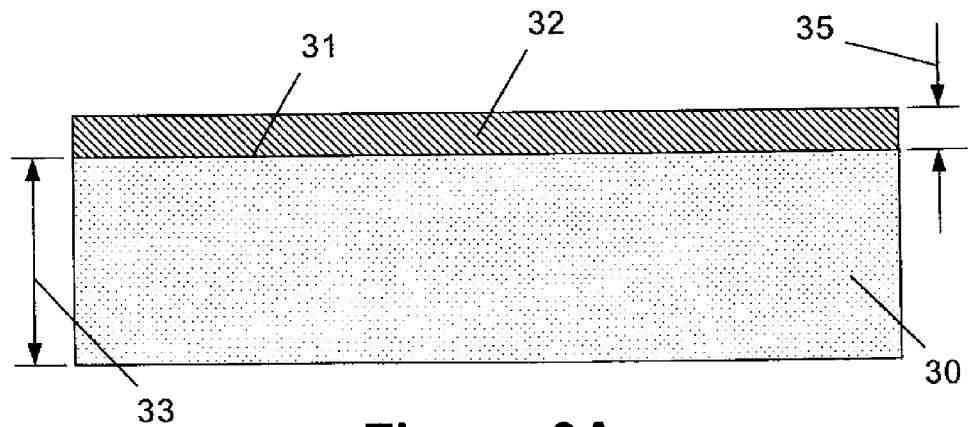
FIGS. 3A-3G depict one illustrative process flow that may be performed in accordance with one embodiment of the present invention.

FIGS. 3A-3G depict one illustrative process flow that may be performed in accordance with one illustrative embodiment of the present invention. As shown in FIG. 3A, a metal layer 32 is formed on a surface 31 of a semiconducting substrate 30, such as silicon. The substrate 30 may be a standard silicon wafer that is commercially available in the marketplace or it may be a sheet of such material. The thickness 33 of the substrate 30 may also vary. In one illustrative embodiment, the thickness 33 may range from approximately 200-700 µm.

The metal layer 32 may be comprised of a variety of materials, such as copper, platinum, aluminum, tantalum/copper (bi-layer), and it may have a thickness 35 that ranges from approximately 150-250 nm (1500-2500 Å). In fact, for reasons that will be understood after a complete reading of the present application, in some embodiments, the metal layer 32 may be made as thin as possible while still accomplishing its intended function. The metal layer 32 may be formed using a variety of processes, such as chemical vapor deposition (CVD), physical vapor deposition (PVD), plasma enhanced chemical vapor deposition (PECVD), electroplating or electroless processes, etc. Depending upon the material selected for the metal layer 32, a separate seed layer (not shown), such as a copper seed layer, may be formed on the surface 31 of the substrate 30 prior to the formation of the metal layer 32.

Figure 3B:
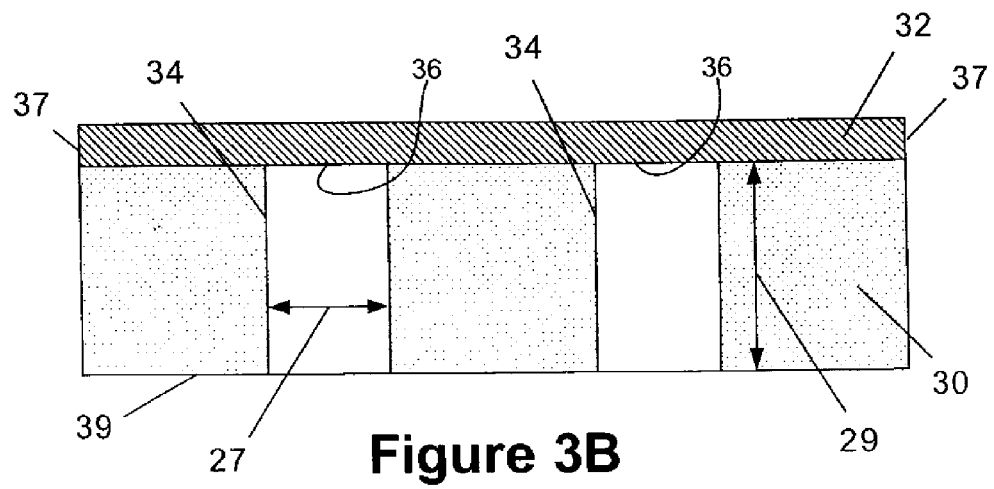

Next, as shown in FIG. 3B, a plurality of openings 34 are formed in the substrate 30. The openings 34 extend from a second surface 39 of the substrate 30 to the metal layer 32. The formation of the openings 34 exposes a portion of the metal layer 32. The size, shape and configuration of the openings 34 may vary depending upon the particular application. For example, the opening 34 may have a circular or rectangular cross-sectional configuration. In one illustrative embodiment, the openings 34 may have a width 27 that ranges from approximately 30-80 µm and a depth 29 as large as approximately 700-750 µm. The depth 29 will correspond to the thickness 33 of the substrate 30. As such, the openings 34 may have an aspect ratio (depth over width) that ranges from approximately 8.7-25.

The openings 34 may be formed by a variety of techniques, such as, for example, a laser process, a dry etch process, a photoelectrochemical process, etc., or a combination of these processes. Depending upon the particular process flow selected, the metal layer 32 may act as an etch stop layer. After the openings 34 are formed, a cleaning process may be performed to remove residual materials from the openings 34. The material used for the metal layer 32 should be selected such that it is compatible with the cleaning materials and processes used to form and clean the openings 34.

As mentioned above, a combination of processes may be used to form the openings 34. For example, in one illustrative embodiment, a laser process may be performed to remove the bulk of the substrate material within the openings 34, i.e., approximately 70-80% of the substrate material may be removed using a laser process. Thereafter, a dry etch process, with a removal rate on the order of approximately 2-3 µm/min, or a photoelectrochemical etch process, with a removal rate on the order of approximately 1-2 µm/min may be used to remove the remaining substrate material.

Figure 3C:
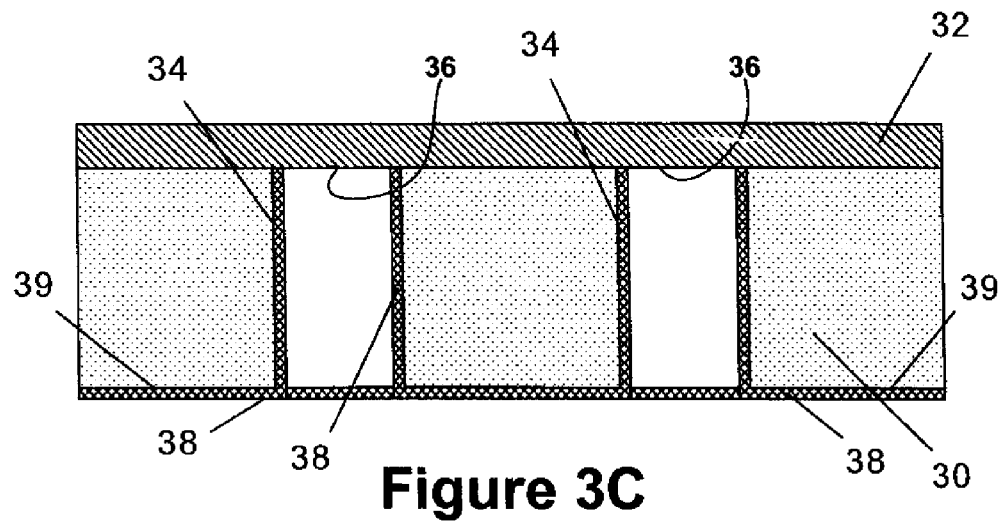

The next operation involves the formation of a layer of insulating material 38 in the openings 34 and on the surface 39 of the substrate 30, as shown in FIG. 3C. The layer of insulating material 38 may be comprised of a variety of materials, and it may be formed by a variety of techniques. For example, the layer of insulating material 38 may be comprised of silicon dioxide or paralene. In one particularly illustrative embodiment, the layer of insulating material 38 may be comprised of a thermally grown layer of silicon dioxide having a thickness that ranges from approximately 100-500 nm.

Figure 3D:
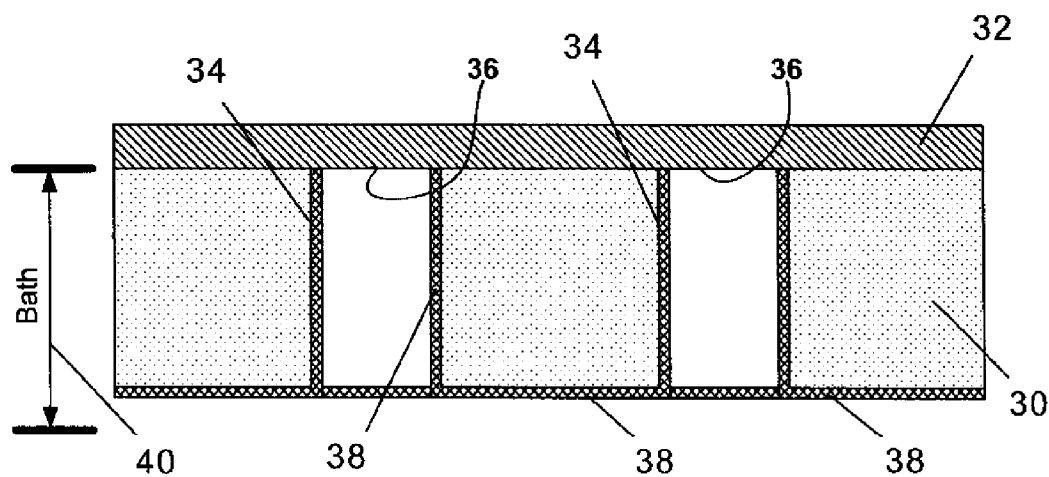
Figure 3E:
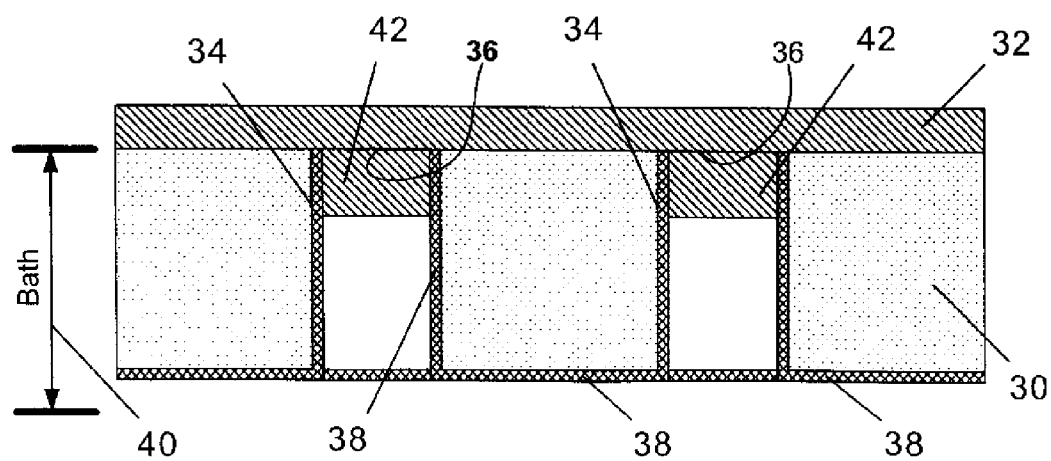
Figure 3F:
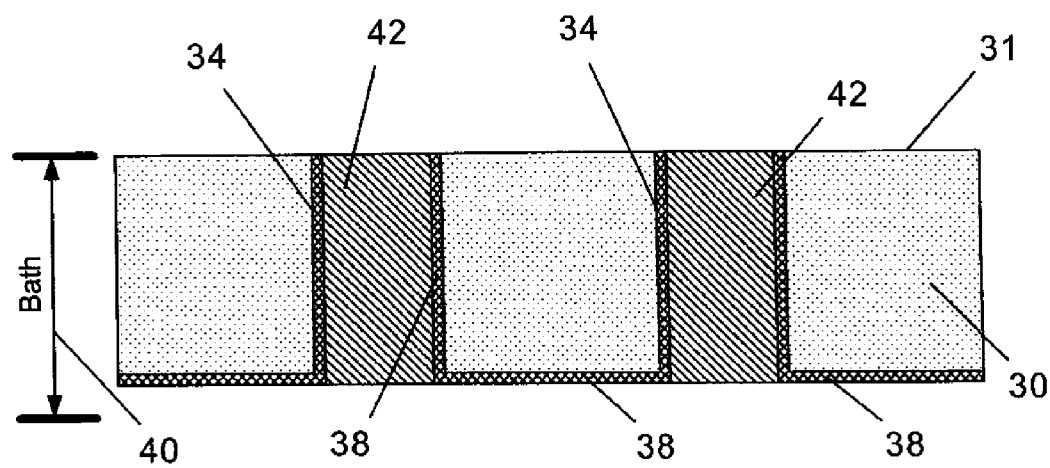

The next step involves forming a conductive metal contact 42 (see FIG. 3F) in the openings 34. This may be accomplished by performing a variety of different processes, e.g., an electroplating process or an electroless plating process. Since an electroplating process cannot be performed on an oxide, a spacer etch is performed to expose the bottom metal plate 32. For example, as depicted in FIG. 3D, the substrate 30 may be positioned in a liquid bath 40 such that the surface 36 of the metal layer 32 within the opening 34 contacts the liquid bath 40. At that time, the deposition/plating process is performed to form the metal contact 42 within the opening 34. FIG. 3E depicts the situation where the contact 42 is in its initial stages of formation. The process is continued until such time as the contact 42 fills the opening 34, as shown in FIG. 3F. The plated material may be comprised of, for example, nickel, copper, silver, platinum or like materials. Depending upon the particular processes used, a separate spacer etch may need to be performed to expose portions of the metal layer 32 within the opening 34, e.g., in the case where the insulating material 38 is formed by a deposition process.

Figure 3G:
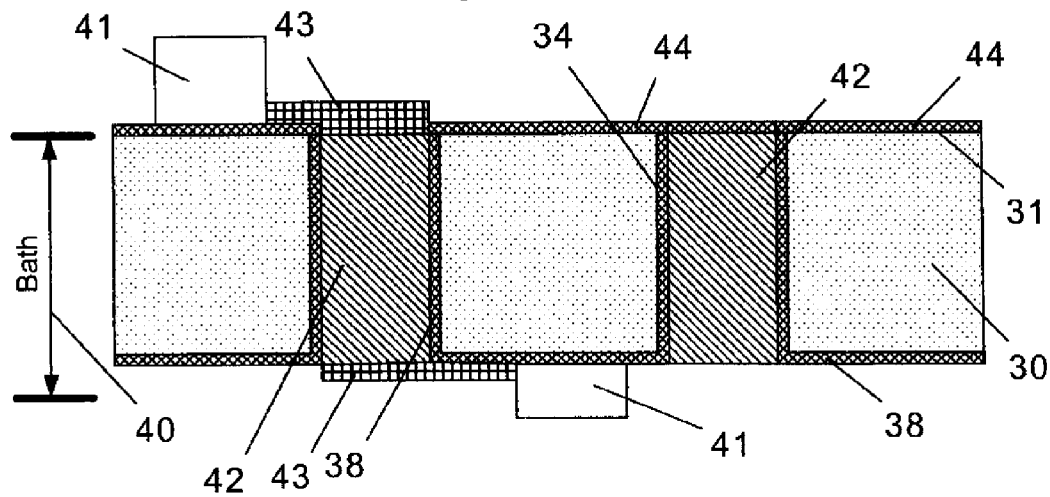

Next, as shown in FIG. 3F, one or more chemical mechanical polishing (CMP) operations are performed to remove portions of the metal layer 32 positioned outside of the openings 34 to thereby result in the completed metal contacts 42 depicted in FIG. 3F. To the extent any metal material is formed on the sidewalls 37 (see FIG. 3B) of the metal layer 32 during the process used to form the metal contacts 42, it will be removed during the CMP process. After the structure depicted in FIG. 3F has been formed, a layer of insulating material 44 may be formed above the surface 31 of the substrate 30. The layer of insulating material 44 may be formed of the same or similar materials as that of the first layer of insulating material 38 described previously. After this process is complete, traditional manufacturing operations may be performed to couple one or more integrated circuit devices 41, such as memory devices, microprocessors, application-specific integrated circuits, etc., together, as shown in FIG. 3G. These devices 41 may be electrically coupled to one another by wiring 43 that is coupled to the metal contacts 42.

Figure 4A:
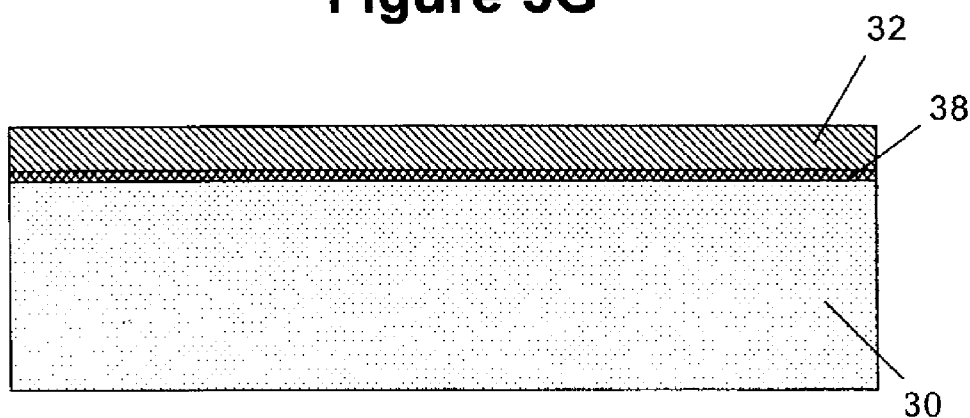
FIGS. 4A-4D depict another illustrative process flow that may be performed in accordance with one illustrative embodiment of the present invention.
Figure 4B:
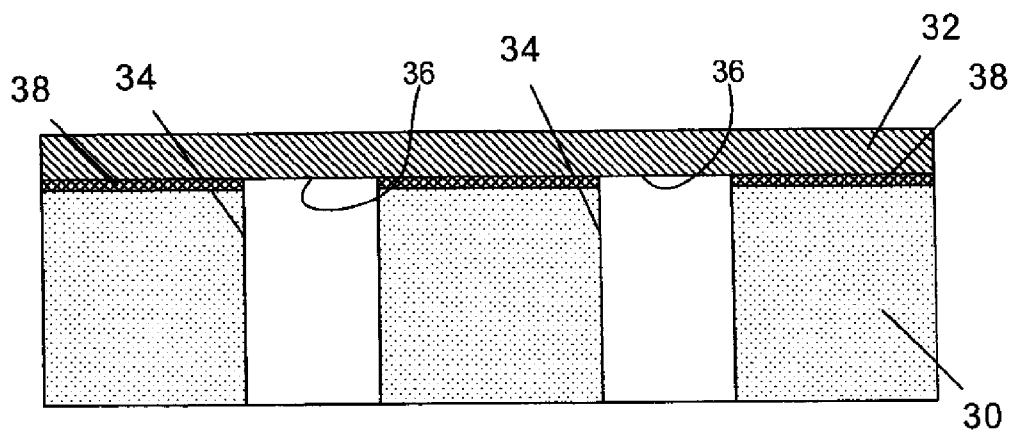

FIGS. 4A-4D depict another illustrative process flow that may be performed in accordance with one illustrative embodiment of the present invention. As shown in FIG. 4A, the layer of insulating material 38 is formed above the surface 31 of the semiconducting substrate 30. In one illustrative embodiment, the layer of insulating material 38 is comprised of a thermally grown layer of silicon dioxide having a thickness ranging from approximately 100-500 nm. The metal layer 32 may, thereafter, be formed above the layer of insulating material 38. Then, as shown in FIG. 4B, one or more etching processes are used to form the openings 34 in the substrate 30 and in the layer of insulating material 38 positioned within the openings 34. That is, the portion of the layer of insulating material 38 positioned adjacent the surface 36 of the metal layer 32 is etched away.

Figure 4C:
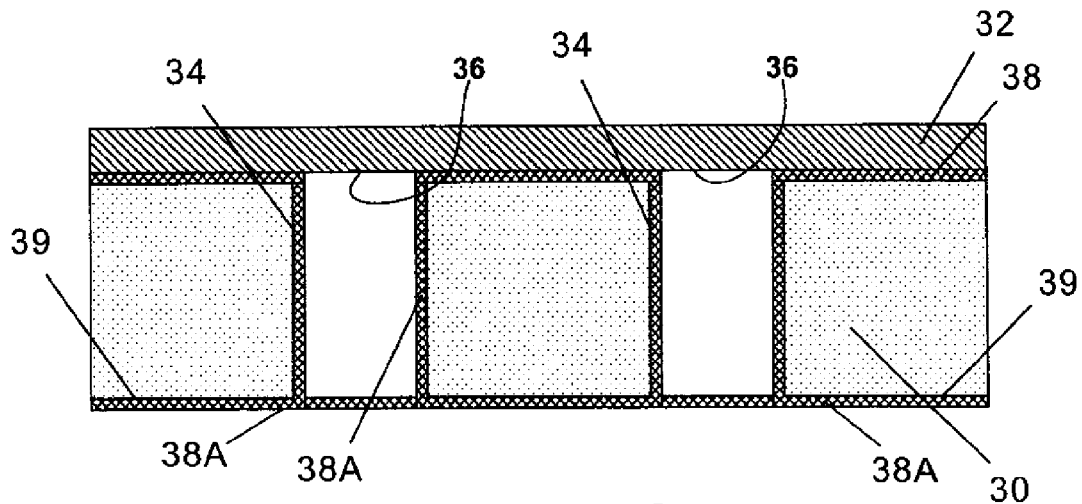
Figure 4D:
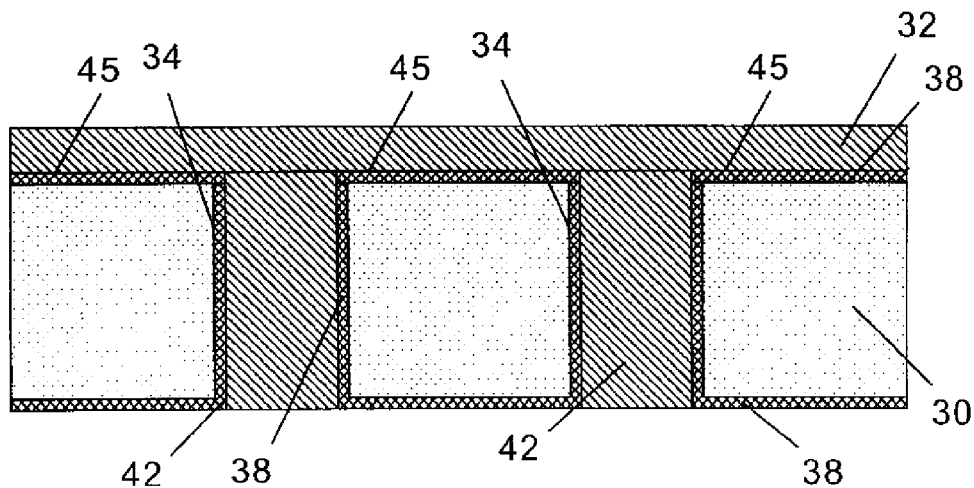

The next process involves the formation of the layer of insulating material 38A on the surface 39 of the substrate 30 and in the openings 34, as shown in FIG. 4C. An electroplating process or an electroless process may then be used to form the conductive contacts 42, as indicated in FIG. 4D. After this process is completed, the portions of the metal layer 32 positioned outside of the openings 34 are removed by performing one or more chemical mechanical polishing operations. Thereafter, traditional operations may be performed as desired. For example, the excess portions of the metal layer 32 may be removed down to the surface 45 of the layer of insulating material 38 by performing one or more CMP processes. Alternatively, the thickness of the metal layer 32 may be reduced and left in place. The thinned metal layer 32 may then be patterned to define the necessary wiring lines for the various devices coupled to the substrate 30.

The present invention is generally directed to various methods of forming conductive through-wafer vias. In one illustrative embodiment, the method comprises providing a layer of semiconducting material, forming a layer of metal on a first side of the layer of semiconducting material, forming an opening in the layer of semiconducting material to thereby expose a portion of the layer of metal, the opening extending from at least a second side of the layer of semiconducting material to the layer of metal, and performing a deposition process to form a conductive contact in the opening using the exposed portion of the metal layer as a seed layer. In further embodiments, the layer of semiconducting material may be comprised of silicon, and the layer of metal may be comprised of copper, nickel or platinum.

In another illustrative embodiment, the method comprises providing a layer of semiconducting material, forming a first layer of insulating material on a first side of the layer of semiconducting material, forming a layer of metal on the first layer of insulating material, forming an opening in the layer of semiconducting material and the first layer of insulating material to thereby expose a portion of the layer of metal, the opening extending from at least a second side of the layer of semiconducting material to the layer of metal, and performing a deposition process to form a conductive contact in at least the opening using the exposed portion of the metal layer as a seed layer.

It should be understood from the foregoing that the present invention is not limited to silicon interposer applications. Rather, the present invention may be employed in a variety of other contexts, such as contact boards, flip chips and stacked chips.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A device for electrically coupling a first integrated circuit device to a second integrated circuit device, comprising:

a semiconductor material having a first side and a second side;

a metal seed layer on the first side of the semiconductor material;

an opening in the semiconductor material that extends from the second side to the first side of the semiconductor material but not through the seed layer, and with the seed layer covering one end of the opening without extending into the opening; and a conductive contact positioned at least partially within the opening, the conductive contact integral with and conductively coupled to the seed layer.

2. The device of claim 1, further comprising a layer of insulating material between the seed layer and the first side of the semiconductor material.

3. The device of claim 1, wherein the seed layer has a thickness that ranges from approximately 150-250 nm.

4. A device, comprising:
a semiconductor material having a first side and a second side;
a layer of insulating material on the first side of the semiconductor material;
a metal seed layer on the layer of insulating material;
an opening in the semiconductor material and the insulating layer of material that extends from the second side of the semiconductor material and through the insulating layer of material but not through the seed layer, and with the seed layer covering one end of the opening without extending into the opening; and
a conductive contact positioned at least partially within the opening, the conductive contact joined with the seed layer.

5. A device for electrically connecting a first integrated circuit device to a second integrated circuit device, comprising:
a layer of semiconductor material;
a metal seed layer on a first side of the layer of semiconductor material;
an opening in the layer of semiconductor material that extends from a second side to the first side of the layer of semiconductor material but not through the seed layer, and with the seed layer covering one end of the opening without extending into the opening; and
a conductive contact in the opening and integral with and conductively coupled to the seed layer, and with the conductive contact partially filling the opening and not extending to the second side of the layer of semiconductor material.

6. The device of claim 5 further comprising an insulating layer on the second side of the layer of semiconductor material.

7. The device of claim 5 further comprising a plurality of openings spaced apart on the layer of semiconductor material, with substantially all of the openings extending from the first to the second side of the layer of semiconductor material, and with substantially each opening partially filled with the conductive contact extending from the seed layer partway towards the second side of the layer of semiconductor material.

8. A semiconductor connecting device, comprising:
a semiconductor material layer;
a primary metal seed layer on a first side of semiconductor material layer;
an insulating layer on a second side of the semiconductor material layer;
holes in the layer of semiconductor material that extend through the semiconductor material layer but not through the metal seed layer; and
a metal contact in substantially each of the holes, with each metal contact having a first end joined the seed layer and having a second end extending entirely through the semiconductor material layer to the second side of the semiconductor material layer.

9. The semiconductor connecting device of claim 8 with the insulating layer comprising a primary outer layer.

10. The semiconductor connecting device of claim 8 wherein the insulating layer is unpolished.

* * * * *

UNITED STATES PATENT AND TRADEMARK OFFICE
CERTIFICATE OF CORRECTION

Page 1 of 1

PATENT NO.        : 7,750,477 B2
APPLICATION NO.   : 11/677257
DATED             : July 6, 2010
INVENTOR(S)       : Nishant Sinha It is certified that error appears in the above-identified patent and that said Letters Patent is hereby corrected as shown below:

Column 1, line 42, "continues" should read --continue--.
    Column 1, line 43, "improves" should read --improve--.
    Column 1, line 51, "die" should read --dies--.
    Column 1, line 53, "die" should read --dies--.
    Column 1, line 62, "die" should read --dies--.
    Column 3, line 26, insert -- - -- after the word "through".
    Column 8, line 22, insert --the-- after the word "of".
    Column 8, line 30, insert --to-- after the word "joined".

Signed and Sealed this
Twenty-eighth Day of June, 2011

David J. Kappos
*Director of the United States Patent and Trademark Office*